(12) United States Patent
Maleki et al.

(10) Patent No.: US 7,991,025 B2
(45) Date of Patent: Aug. 2, 2011

(54) TUNABLE LASERS LOCKED TO WHISPERING GALLERY MODE RESONATORS

(75) Inventors: Lutfollah Maleki, Pasadena, CA (US); Vladimir Ilchenko, Arcadia, CA (US)

(73) Assignee: OEwaves, Inc., Pasadena, CA (US)

( * ) Notice: Subject to any disclaimer, the term of this patent is extended or adjusted under 35 U.S.C. 154(b) by 80 days.

(21) Appl. No.: 12/139,449

(22) Filed: Jun. 13, 2008

(65) Prior Publication Data
US 2008/0310463 A1 Dec. 18, 2008

Related U.S. Application Data

(60) Provisional application No. 60/934,524, filed on Jun. 13, 2007.

(51) Int. Cl.
*H01S 3/10* (2006.01)
(52) U.S. Cl. ............. 372/20; 372/12; 372/32; 372/67; 372/102
(58) Field of Classification Search .......... 372/20, 372/21, 66–68, 70–75, 92–103; 272/20
See application file for complete search history.

(56) References Cited

U.S. PATENT DOCUMENTS

| 5,162,866 | A * | 11/1992 | Tomiya et al. ............. 356/237.1 |
| 5,204,640 | A | 4/1993 | Logan, Jr. |
| 5,220,292 | A | 6/1993 | Bianchini et al. |
| 5,723,856 | A | 3/1998 | Yao et al. |
| 5,751,747 | A | 5/1998 | Lutes et al. |
| 5,777,778 | A | 7/1998 | Yao |
| 5,917,179 | A | 6/1999 | Yao |
| 5,929,430 | A | 7/1999 | Yao et al. |
| 5,985,166 | A | 11/1999 | Unger et al. |
| 6,009,115 | A | 12/1999 | Ho |
| 6,080,586 | A | 6/2000 | Baldeschwieler et al. |
| 6,178,036 | B1 | 1/2001 | Yao |
| 6,203,660 | B1 | 3/2001 | Unger et al. |
| 6,389,197 | B1 | 5/2002 | Iltchenko et al. |
| 6,417,957 | B1 | 7/2002 | Yao |
| 6,473,218 | B1 | 10/2002 | Maleki et al. |
| 6,476,959 | B2 | 11/2002 | Yao |
| 6,487,233 | B2 | 11/2002 | Maleki et al. |
| 6,488,861 | B2 | 12/2002 | Iltchenko et al. |
| 6,490,039 | B2 * | 12/2002 | Maleki et al. .............. 356/436 |
| 6,535,328 | B2 | 3/2003 | Yao |
| 6,567,436 | B1 | 5/2003 | Yao et al. |
| 6,580,532 | B1 | 6/2003 | Yao et al. |
| 6,594,061 | B2 | 7/2003 | Huang et al. |
| 6,762,869 | B2 * | 7/2004 | Maleki et al. .............. 359/239 |

(Continued)

FOREIGN PATENT DOCUMENTS
WO 01/96936 12/2001
(Continued)

OTHER PUBLICATIONS

Braginsky, V.B., et al., "Quality-Factor and Nonlinear Properties of Optical Whispering-Gallery Modes," *Physics Letters A*, 137(7, 8):393-397, May 1989.

(Continued)

*Primary Examiner* — Minsun Harvey
*Assistant Examiner* — Xinning Niu
(74) *Attorney, Agent, or Firm* — Perkins Coie LLP

(57) ABSTRACT

Techniques and devices that stabilize a laser to a whispering gallery mode optical resonator.

26 Claims, 8 Drawing Sheets

U.S. PATENT DOCUMENTS

| | | |
|---|---|---|
| 6,795,481 B2 | 9/2004 | Maleki et al. |
| 6,798,947 B2 | 9/2004 | Iltchenko |
| 6,853,479 B1 | 2/2005 | Ilchenko et al. |
| 6,871,025 B2 | 3/2005 | Levi et al. |
| 6,873,631 B2 | 3/2005 | Yao et al. |
| 6,879,752 B1 | 4/2005 | Ilchenko et al. |
| 6,891,865 B1* | 5/2005 | Ma .................................. 372/20 |
| 6,901,189 B1 | 5/2005 | Savchenkov et al. |
| 6,906,309 B2 | 6/2005 | Sayyah et al. |
| 6,922,497 B1 | 7/2005 | Savchenkov et al. |
| 6,928,091 B1 | 8/2005 | Maleki et al. |
| 6,943,934 B1 | 9/2005 | Ilchenko et al. |
| 6,987,914 B2 | 1/2006 | Savchenkov et al. |
| 7,024,069 B2 | 4/2006 | Savchenkov et al. |
| 7,043,117 B2 | 5/2006 | Matsko et al. |
| 7,050,212 B2 | 5/2006 | Matsko et al. |
| 7,061,335 B2 | 6/2006 | Maleki et al. |
| 7,062,131 B2 | 6/2006 | Ilchenko |
| 7,092,591 B2 | 8/2006 | Savchenkov et al. |
| 7,133,180 B2 | 11/2006 | Ilchenko et al. |
| 7,173,749 B2 | 2/2007 | Maleki et al. |
| 7,184,451 B2 | 2/2007 | Ilchenko et al. |
| 7,187,870 B2 | 3/2007 | Ilchenko et al. |
| 7,218,662 B1 | 5/2007 | Ilchenko et al. |
| 7,248,763 B1 | 7/2007 | Kossakovski et al. |
| 7,260,279 B2 | 8/2007 | Gunn et al. |
| 7,283,707 B1 | 10/2007 | Maleki et al. |
| 7,356,214 B2 | 4/2008 | Ilchenko |
| 7,362,927 B1 | 4/2008 | Ilchenko et al. |
| 7,369,722 B2 | 5/2008 | Yilmaz et al. |
| 7,389,053 B1 | 6/2008 | Ilchenko et al. |
| 7,400,796 B1 | 7/2008 | Kossakovski et al. |
| 7,440,651 B1 | 10/2008 | Savchenkov et al. |
| 7,460,746 B2 | 12/2008 | Maleki et al. |
| 7,480,425 B2 | 1/2009 | Gunn et al. |
| 2001/0038651 A1 | 11/2001 | Maleki et al. |
| 2002/0018611 A1 | 2/2002 | Maleki et al. |
| 2002/0018617 A1 | 2/2002 | Iltchenko et al. |
| 2002/0021765 A1 | 2/2002 | Maleki et al. |
| 2002/0081055 A1 | 6/2002 | Painter et al. |
| 2002/0085266 A1 | 7/2002 | Yao |
| 2002/0097401 A1 | 7/2002 | Maleki et al. |
| 2003/0112835 A1* | 6/2003 | Williams et al. .................. 372/6 |
| 2003/0160148 A1 | 8/2003 | Yao et al. |
| 2004/0100675 A1 | 5/2004 | Matsko et al. |
| 2004/0109217 A1 | 6/2004 | Maleki et al. |
| 2004/0218880 A1 | 11/2004 | Matsko et al. |
| 2004/0240781 A1 | 12/2004 | Savchenkov et al. |
| 2005/0017816 A1 | 1/2005 | Ilchenko et al. |
| 2005/0063034 A1 | 3/2005 | Maleki et al. |
| 2005/0074200 A1 | 4/2005 | Savchenkov et al. |
| 2005/0123306 A1 | 6/2005 | Ilchenko et al. |
| 2005/0128566 A1 | 6/2005 | Savchenkov et al. |
| 2005/0175358 A1 | 8/2005 | Ilchenko et al. |
| 2005/0185681 A1* | 8/2005 | Ilchenko et al. ................. 372/20 |
| 2005/0248823 A1 | 11/2005 | Maleki et al. |
| 2007/0009205 A1 | 1/2007 | Maleki et al. |
| 2007/0153289 A1 | 7/2007 | Yilmaz et al. |
| 2008/0001062 A1 | 1/2008 | Gunn et al. |
| 2008/0075464 A1 | 3/2008 | Maleki et al. |
| 2009/0097516 A1 | 4/2009 | Maleki et al. |
| 2009/0135860 A1 | 5/2009 | Maleki et al. |

FOREIGN PATENT DOCUMENTS

| | | |
|---|---|---|
| WO | 2005/038513 | 4/2005 |
| WO | 2005/055412 | 6/2005 |
| WO | 2005/067690 | 7/2005 |
| WO | 2005/122346 | 12/2005 |
| WO | 2006/076585 | 7/2006 |
| WO | 2007/143627 | 12/2007 |

OTHER PUBLICATIONS

Eliyahu, D., et al., "Low Phase Noise and Spurious Levels in Multi-Loop Opto-Electronic Oscillators," *Proceedings of the 2003 IEEE International Frequency Control Sympsoium and PDA Exhibition*, pp. 405-410, May 2003.

Eliyahu, D., et al., "Modulation Response ($S_{21}$) of the Coupled Opto-Electronic Oscillator," *Proceedings of the 2005 IEEE International Frequency Control Symposium and Exposition*, pp. 850-856, Aug. 2005.

Eliyahu, D., et al., "Tunable, Ultra-Low Phase Noise YIG Based Opto-Electronic Oscillator," *IEEE MTT-S International Microwave Symposium Digest*, 3:2185-2187, Jun. 2003.

Gorodetsky, M.L., et al., "Optical Microsphere Resonators: Optimal Coupling to High-$Q$ Whispering-Gallery Modes," *J.Opt. Soc. Am. B*, 16(1):147-154, Jan. 1999.

Gorodetsky, M.L., et al., "Rayleigh Scattering in High-$Q$ Microspheres," *J. Opt. Soc. Am. B*, 17(6):1051-1057, Jun. 2000.

Gorodetsky, M.L., et al., "Ultimate $Q$ of Optical Microsphere Resonators," *Optics Letters*, 21(7):453-455, Apr. 1996.

Hryniewicz, J.V., et al., "Higher Order Filter Response in Coupled Microring Resonators," *IEEE Photonics Technology Letters*, 12(3):320-322, Mar. 2000.

Huang, S., et al., "A 'Turnkey' Optoelectronic Oscillator with Low Acceleration Sensitivity," *2000 IEEE/EIA International Frequency Control Symposium and Exhibition*, pp. 269-279, Jun. 2000.

Ilchenko, V., et al., "Electrooptically Tunable Photonic Microresonators and Photonic Bandgap Waveguide Coupling for Micro-Optoelectronic Oscillators," *GOMACTech 2003*, Tampa, Florida, pp. 1-4.

Ilchenko, V., et al., "High-Q Microsphere Cavity for Laser Stabilization and Optoelectronic Microwave Oscillator," *Proceedings SPIE Microresonators and Whispering-Gallery Modes*, vol. 3611, pp. 190-198, Jan. 1999.

Ilchenko, V., et al., "Microsphere Integration in Active and Passive Photonics Devices," *Proc. of SPIE Laser Resonators III*, vol. 3930, pp. 154-162, Jan. 2000.

Ilchenko, V., et al., "Microtorus: A High-Finesse Microcavity with Whispering-Gallery Modes," *Optics Letters*, 26(5):256-258, Mar. 2001.

Ilchenko, V., et al., "Pigtailing the High-$Q$ Microsphere Cavity: A Simple Fiber Coupler for Optical Whispering-Gallery Modes," *Optics Letters*, 24(11):723-725, Jun. 1999.

Ilchenko, V., et al., "Tunability and Synthetic Lineshapes in High-Q Optical Whispering Gallery Modes," *Proc. of SPIE Laser Resonators and Beam Control VI*, vol. 4969, pp. 195-206, Jan. 2003.

Ilchenko, V., et al., "Whispering-Gallery-Mode Electro-Optic Modulator and Photonic Microwave Receiver," *J. Opt. Soc. Am. B*, 20(2):333-342, Feb. 2003.

Ilchenko, V., et al., "Sub-Micro Watt Photonic Microwave Receiver," *IEEE Photonics Technology Letters*, 14(11):1602-1604, Nov. 2002.

Ito, H., et al., "InP/InGaAs Uni-Travelling-Carrier Photodiode with 310 GHz Bandwidth," *Electronics Letters*, 36(21):1809-1810, Oct. 2000.

Logan, R., et al., "Stabilization of Oscillator Phase Using a Fiber-Optic Delay-Line," *IEEE 45th Annual Symposium on Frequency Control*, pp. 508-512, May 1991.

Maleki, L., "The Opto-Electronic Oscillator: Prospects for Extending the State of the Art in Reference Frequency Generation," *International Topical Meeting on Microwave Photonics*, pp. 195-198, Oct. 1998.

Matsko, A., et al., "Active Mode Locking with Whispering-Gallery Modes," *J. Opt. Soc. Am. B*, 20(11):2292-2296, Nov. 2003.

Matsko, A., et al., "Whispering-Gallery-Mode based Optoelectronic Microwave Oscillator," *Journal of Modern Optics*, 50(15-17):2523-2542, Feb. 2004.

Matsko, A., et al., "Whispering-Gallery-Mode Resonators as Frequency References. I. Fundamental Limitations," *J. Opt. Soc. Am. B*, 24(6):1324-1335, Jun. 2007.

Myers, L.E., et al., "Quasi-Phase-Matched Optical Parametric Oscillators in Bulk Periodically Poled $LiNbO_3$," *J. Opt. Soc. Am. B*, 12(11):2102-2116, Nov. 1995.

Savchenkov, A., et al., "Whispering-Gallery-Mode Resonators as Frequency References. II. Stabilization," *J. Opt. Soc. Am. B*, 24(12): 2988-2997, Dec. 2007.

Vassiliev, V.V., et al., "Narrow-Line-Width Diode Laser with a High-$Q$ Microsphere Resonator," *Optics Communications*, 158(1-6):305-312, Dec. 1998.

Yao, X.S., et al., "A Novel Photonic Oscillator," *Digest of the LEOS Summer Topical Meetings*, pp. 17-18, Aug. 1995.

Yao, X.S., et al., "A Novel Photonic Oscillator," *TDA Progress Report 42-122*, pp. 32-43, Aug. 1995.

Yao, X.S., et al., "Converting Light into Spectrally Pure Microwave Oscillation," *Optics Letters*, 21(7):483-485, Apr. 1996.

Yao, X.S., et al., "Coupled Optoelectronic Oscillators for Generating Both RF Signal and Optical Pulses," *Journal of Lightwave Tecnhology*, 18(1):73-78, Jan. 2000.

Yao, X.S., et al., "Dual Microwave and Optical Oscillator," *Optics Letters*, 22(24):1867-1869, Dec. 1997.

Yao, X.S., et al., "Multiloop Optoelectronic Oscillator," *IEEE Journal of Quantum Electronics*, 36(1):79-84, Jan. 2000.

Yao, X.S., et al., "Optoelectronic Microwave Oscillator," *J. Opt. Soc. Am. B*, 13(8):1725-1735, Aug. 1996.

Yao, X.S., et al., "Optoelectronic Oscillator for Photonic Systems," *IEEE Journal of Quantum Electronics*, 32(7):1141-1149, Jul. 1996.

Yu, J., et al., "Compact Optoelectronic Oscillator with Ultra-Low Phase Noise Performance," *Electronics Letters*, 35(18):1554-1555, Sep. 1999.

International Search Report and Written Opinion dated Nov. 26, 2008 for International Application No. PCT/US2008/67037, filed Jun. 13, 2008 (7 pages).

\* cited by examiner

TUNABLE LASERS LOCKED TO WHISPERING GALLERY MODE RESONATORS

PRIORITY CLAIM AND RELATED APPLICATION

This application claims the benefit of U.S. Provisional Application No. 60/934,524 entitled "Compact, Tunable, Ultranarrow-Line Source Based on a Laser Injection Locked to a Whispering Gallery Mode Optical Resonator" and filed Jun. 13, 2007, the disclosure of which is incorporated by reference as part of the specification of this application.

BACKGROUND

This application relates to lasers and laser stabilization.

A laser can be subject to various perturbations and changes and the laser operations can be adversely affected by such perturbations and changes. For example, temperature fluctuations and vibrations can cause the laser to fluctuate in the laser wavelength, and the laser power level and the optical phase of the laser. Various laser stabilization techniques can be used to stabilize a laser against perturbations and changes and to reduce the laser linewidth.

One example of laser stabilization techniques uses a Fabry-Perot cavity as an optical reference to detect a change in the laser frequency with respect to a resonance frequency of the Fabry-Perot cavity and an error signal is generated based on this frequency change and is fed into an electronic locking circuit that tunes the laser to lock or stabilize the laser frequency relative to the resonance frequency of the Fabry-Perot cavity. In addition to the above electronic feedback and locking, a Fabry-Perot cavity can be used as an optical frequency reference to directly provide optical feedback to a laser in an optical injection locking scheme to stabilize the laser. For example, the laser output of a semiconductor laser can be directed into an external reference Fabry-Perot cavity and the optical reflection or transmission of the external Fabry-Perot cavity can be directed back into the semiconductor laser to stabilize the laser wavelength and to reduce the laser linewidth of the semiconductor laser.

SUMMARY

The specification of this application describes, among others, examples and implementations of lasers stabilized to optical whispering gallery mode via optical injection. In one aspect, a laser device includes a laser that is tunable in response to a control signal and produces a laser beam at a laser frequency; and an optical resonator structured to support a whispering gallery mode circulating in the optical resonator, the optical resonator being optically coupled to the laser to receive a portion of the laser beam into the optical resonator in the whispering gallery mode and to feed laser light in the whispering gallery mode in the optical resonator back to the laser to stabilize the laser frequency at a frequency of the whispering gallery mode and to reduce a linewidth of the laser.

These and other examples and implementations are described in detail in the drawings, the detailed description, and the claims.

DETAILED DESCRIPTION

A laser can be locked to a whispering gallery mode (WGM) resonator for line narrowing and stabilization by directing the laser light out of the laser into the WGM resonator and then feeding the laser light out of the WGM resonator via direct injection into the laser. Optical WGM resonators confine light in a whispering gallery mode that is totally reflected within a closed circular optical path. Unlike Fabry-Perot resonators, light in WGM resonators cannot exit the resonators by optical transmission and thus can be used to produce optical resonators with high optical quality factors that may be difficult to achieve with Febry-Perot resonators. Light in a WGM resonator "leaks" out of the exterior surface of the closed circular optical path of a WGM resonator via the evanescence field of the WG mode. An optical coupler can be used to couple light into or out of the WGM resonator via this evanescent field. As an example, a semiconductor laser can be directly coupled to a high quality factor Q whispering gallery mode resonator (WGM) via optical coupling in an optical injection design to stabilize the laser. A portion of the light passing through the resonator is reflected back to the laser to have the laser frequency (wavelength) be locked to the frequency of the high Q mode of the resonator, and to narrow its spectral line. If the WGM resonator is stabilized against environmental perturbations such as temperature variations or vibration, the stability of the modal frequency of the resonator is transferred to the laser frequency or wavelength.

The WGM resonator can be made from an electro-optic material and can be tuned by changing the electrical control signal applied to the material. Because the optical injection locking, the laser wavelength or frequency can be tuned with the application of a DC voltage applied to the resonator. In addition, by applying a microwave or RF field to the WGM resonator having a frequency that matches one or more free spectral range of the resonator, the laser frequency can be phase, and/or amplitude modulated. Since the modal frequency of the resonator can be varied by application of temperature, pressure, or in the case of resonators made with electrooptic material, an applied DC potential, the frequency (wavelength) of the laser can also be tuned. Furthermore, the laser remains locked in frequency (wavelength) to the resonator if the frequency of the laser is modulated through the application of a microwave signal to the DC current applied to the laser. Thus a modulatable, narrow linewidth laser can be obtained. When the WGM resonator is made of an electro-optic material, a microwave or RF field can be applied to the resonator with the appropriate coupling circuitry to modulate the intensity of the laser, which continues to remain locked to the WGM resonator.

Figure 1:
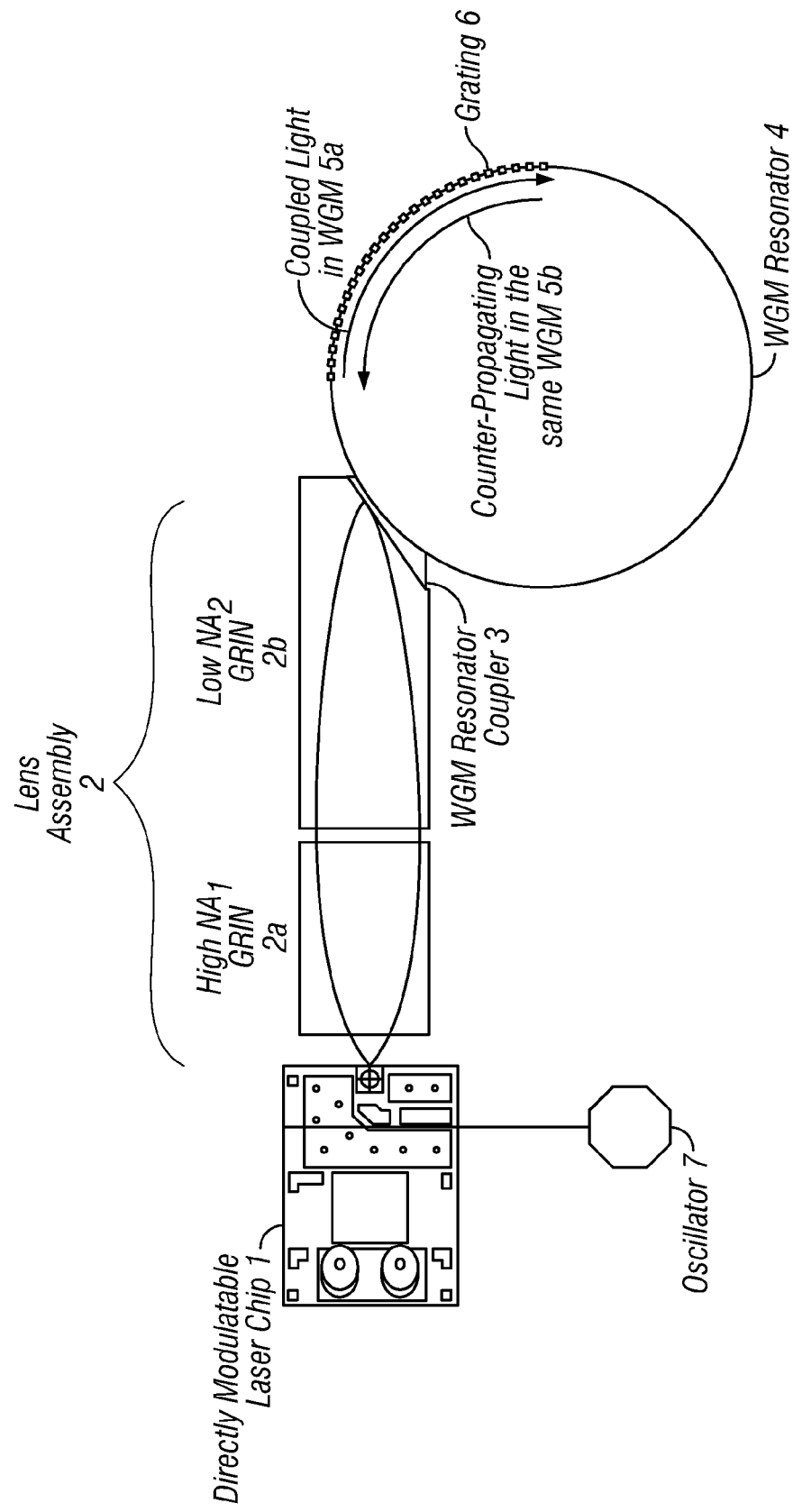
FIG. 1 shows an example of a laser device where a laser is optically coupled to a whispering gallery mode optical resonator and is stabilized to the optical resonator via an optical feedback from the optical resonator.

FIG. 1 shows an example of a laser device where a laser 1 is optically coupled to a whispering gallery mode optical resonator 4 and is stabilized to the optical resonator 4 via an optical feedback from the optical resonator 4. The laser 1 is tunable in response to a control signal from a laser control circuit and may also be modulated by a control signal from an oscillator 7. The laser 1 produces a laser beam at a laser frequency which may drift or fluctuate due to various factors. The optical resonator 4 is structured to support a whispering gallery mode circulating in the optical resonator 4. Two counter propagating beams 5a and 5b inside the optical resonator 4 can be in the same WG mode. The optical resonator 4 is optically coupled to the laser 1 to receive a portion of the laser beam into the optical resonator 4 as the beam 5a in the whispering gallery mode. Scattering inside the WGM optical resonator of the received beam 5a can produce the counter propagating beam 5b in the same WG mode. An optical grating 6 may be optionally formed on the surface of the optical resonator 4 to create the counter propagating beam 5b. This counter propagating beam 5b can be coupled out of the optical resonator 4 in the opposite direction of the incoming laser beam from the laser 1 and thus can be coupled into the laser 1 to achieve the injection locking.

In this example, a WGM resonator coupler 3 is used to couple laser light from the laser 1 into the optical resonator 4 and to couple light of the beam 5b out of the resonator 4 in the whispering gallery mode and a lens assembly 2 and is used direct the laser light back to the laser 1 to stabilize the laser frequency at a frequency of the whispering gallery mode and to reduce a linewidth of the laser 1.

The lens assembly 2 can be implemented in various configurations. In the example in FIG. 1, the lens assembly includes a first GRIN lens 2a located next to the laser 1 and configured to have a small aperture to focus light into the laser 1 and to collect light from the laser 1, and a second GRIN lens 2b located next to the optical coupler 3 and configured to have a large aperture to focus light into the optical coupler 3 and to collect light from the optical coupler 3. The optical coupler 3 can be in various configurations and is a prism in the example in FIG. 1.

The WGM resonator 4 can be a tunable to stabilize the whispering gallery mode against environmental perturbations and the feedback of the laser light from the optical resonator to the laser transfers stability of the whispering gallery mode in the optical resonator to the laser. A resonator tuning mechanism can be provided to control and tune the frequency of the whispering gallery mode. Under the injection locking condition, the tuning of the resonator 4 tunes the laser frequency of the laser 1 via the feedback of the laser light from the optical resonator 4 to the laser 1. In one implementation, the resonator tuning mechanism controls and tunes a temperature of the optical resonator 4 to tune the laser frequency of the laser 1 based on a thermal effect. In another implementation, the resonator tuning mechanism applies and controls a pressure exerted on the optical resonator to tune the laser frequency of the laser. In yet another implementation, the optical resonator 4 comprises an electro-optic material that changes a refractive index in response to an electrical potential applied to the optical resonator 4 and the resonator tuning mechanism applies and controls the electrical potential to tune the laser frequency of the laser 1. The resonator tuning mechanism can also be configured to modulate the electrical potential to modulate the frequency of the whispering gallery mode of the optical resonator 4 and the laser frequency of the laser 1. The controls for the laser 1 and the resonator 4 may be used at the same time to increase the frequency tuning range of the laser and thus a control mechanism can be implemented to both adjust the frequency of the whispering gallery mode of the optical resonator 4 and to adjust the laser frequency of the laser 1 while stabilizing the laser frequency at the frequency of the whispering gallery mode.

Figure 2:
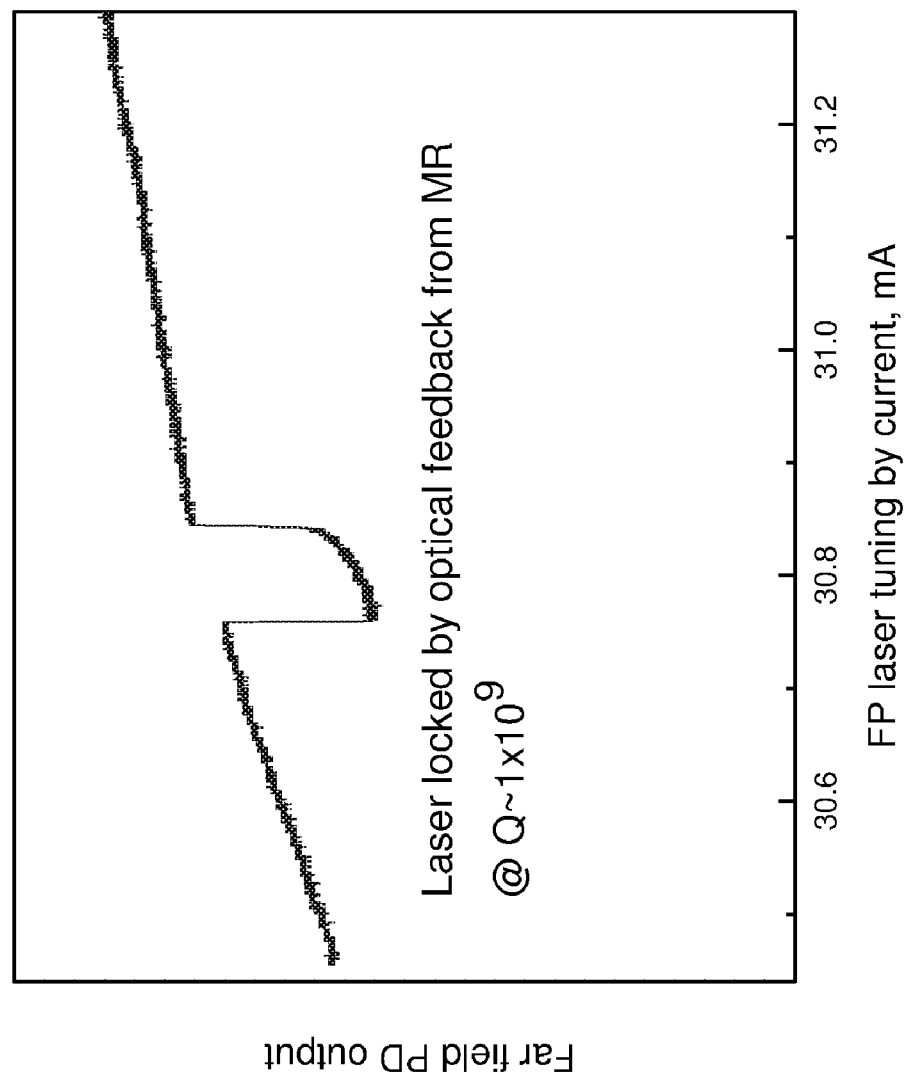
FIG. 2 shows a measurement of a laser output produced by a resonator-stabilized laser based on the laser device in FIG. 1.

FIG. 2 shows a measurement of a laser output produced by a resonator-stabilized laser based on the laser device in FIG. 1. In this example, the WGM resonator 4 has Q of $10^9$ and the laser is a semiconductor laser and the current to the laser is tuned.

Figure 3:
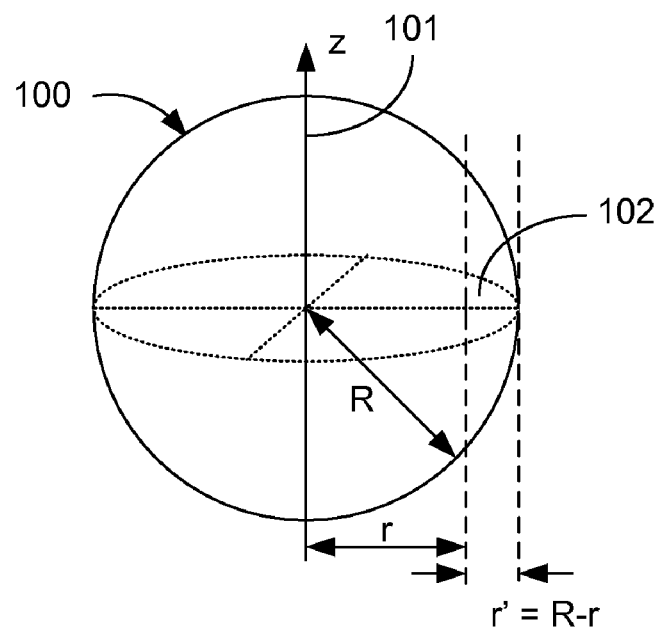
FIGS. 3, 4, 5, 6A, and 6B illustrate various exemplary optical resonator configurations that support whispering gallery modes.
Figure 4:
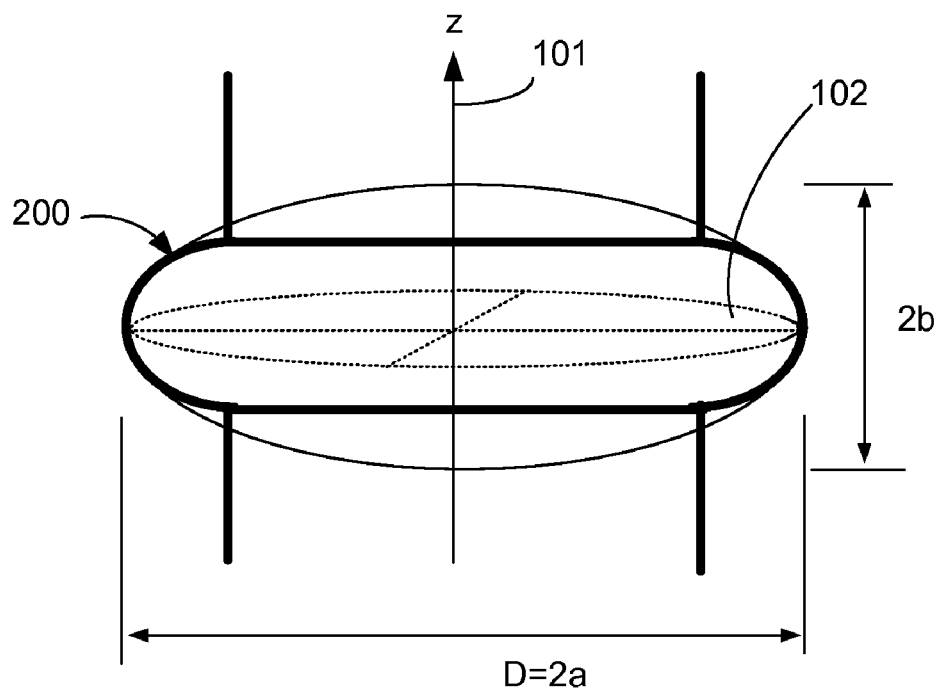
Figure 5:
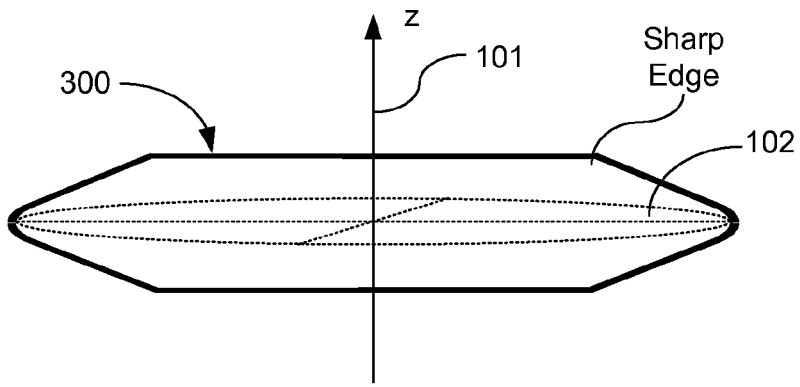

The WGM resonator 4 in FIG. 1 and other devices in this application may be implemented in various configurations. FIGS. 3, 4, and 5 illustrate three exemplary geometries for implementing such WGM resonators.

FIG. 3 shows a spherical WGM resonator 100 which is a solid dielectric sphere. The sphere 100 has an equator in the plane 102 which is symmetric around the z axis 101. The circumference of the plane 102 is a circle and the plane 102 is a circular cross section. A WG mode exists around the equator within the spherical exterior surface and circulates within the resonator 100. The spherical curvature of the exterior surface around the equator plane 102 provides spatial confinement along both the z direction and its perpendicular direction to support the WG modes. The eccentricity of the sphere 100 generally is low.

FIG. 4 shows an exemplary spheroidal microresonator 200. This resonator 200 may be formed by revolving an ellipse (with axial lengths a and b) around the symmetric axis along the short elliptical axis 101 (z). Therefore, similar to the spherical resonator in FIG. 3, the plane 102 in FIG. 4 also has a circular circumference and is a circular cross section. Different from the design in FIG. 3, the plane 102 in FIG. 4 is a circular cross section of the non-spherical spheroid and around the short ellipsoid axis of the spheroid. The eccentricity of resonator 100 is $(1-b^2/a^2)^{1/2}$ and is generally high, e.g., greater than $10^{-1}$. Hence, the exterior surface is the resonator 200 is not part of a sphere and provides more spatial confinement on the modes along the z direction than a spherical exterior. More specifically, the geometry of the cavity in the plane in which Z lies such as the zy or zx plane is elliptical. The equator plane 102 at the center of the resonator 200 is perpendicular to the axis 101 (z) and the WG modes circulate near the circumference of the plane 102 within the resonator 200.

FIG. 5 shows another exemplary WGM resonator 300 which has a non-spherical exterior where the exterior profile is a general conic shape which can be mathematically represented by a quadratic equation of the Cartesian coordinates. Similar to the geometries in FIGS. 3 and 4, the exterior surface provides curvatures in both the direction in the plane 102 and the direction of z perpendicular to the plane 102 to confine and support the WG modes. Such a non-spherical, non-elliptical surface may be, among others, a parabola or hyperbola. The plane 102 in FIG. 5 is a circular cross section and a WG mode circulates around the circle in the equator.

The above three exemplary geometries in FIGS. 3, 4, and 5 share a common geometrical feature that they are all axially or cylindrically symmetric around the axis 101 (z) around which the WG modes circulate in the plane 102. The curved exterior surface is smooth around the plane 102 and provides two-dimensional confinement around the plane 102 to support the WG modes.

Notably, the spatial extent of the WG modes in each resonator along the z direction 101 is limited above and below the plane 102 and hence it may not be necessary to have the entirety of the sphere 100, the spheroid 200, or the conical shape 300. Instead, only a portion of the entire shape around the plane 102 that is sufficiently large to support the whispering gallery modes may be used to for the WGM resonator. For example, rings, disks and other geometries formed from a proper section of a sphere may be used as a spherical WGM resonator.

Figure 6A:
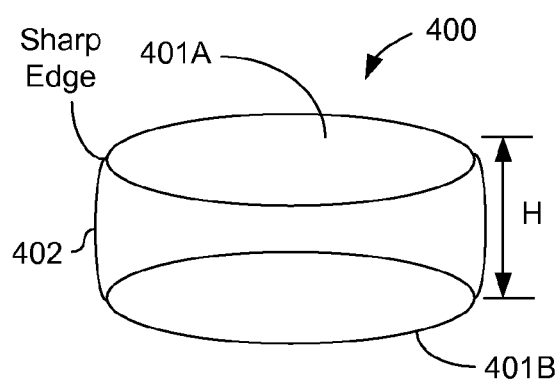
Figure 6B:
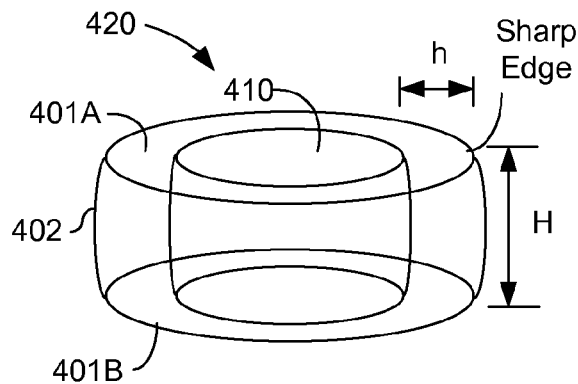

FIGS. 6A and 6B show a disk-shaped WGM resonator 400 and a ring-shaped WGM resonator 420, respectively. In FIG. 6A, the solid disk 400 has a top surface 401A above the center plane 102 and a bottom surface 401B below the plane 102 with a distance H. The value of the distance H is sufficiently large to support the WG modes. Beyond this sufficient distance above the center plane 102, the resonator may have sharp edges as illustrated in FIGS. 5, 6A, and 6B. The exterior curved surface 402 can be selected from any of the shapes shown in FIGS. 3, 4, and 5 to achieve desired WG modes and spectral properties. The ring resonator 420 in FIG. 6B may be formed by removing a center portion 410 from the solid disk 400 in FIG. 6A. Since the WG modes are present near the exterior part of the ring 420 near the exterior surface 402, the thickness h of the ring may be set to be sufficiently large to support the WG modes.

Figure 7A:
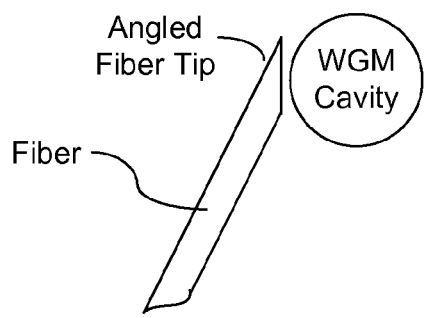
FIGS. 7A and 7B illustrate two evanescent coupling examples for coupling whispering gallery mode optical resonators.
Figure 7B:
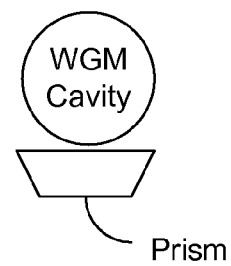

An optical coupler is generally used to couple optical energy into or out of the WGM resonator by evanescent coupling. FIGS. 7A and 7B show two exemplary optical couplers engaged to a WGM resonator. The optical coupler may be in direct contact with or separated by a gap from the exterior surface of the resonator to effectuate the desired critical coupling. FIG. 7A shows an angle-polished fiber tip as a coupler for the WGM resonator. A waveguide with an angled end facet, such as a planar waveguide or other waveguide, may also be used as the coupler. FIG. 7B shows a micro prism as a coupler for the WGM resonator. Other evanescent couplers may also be used, such as a coupler formed from a photonic bandgap material.

In WGM resonators with uniform indices, a part of the electromagnetic field of the WG modes is located at the exterior surface of the resonators. A gap between the optical coupler and the WGM resonator with a uniform index is generally needed to achieve a proper optical coupling. This gap is used to properly "unload" the WG mode. The Q-factor of a WG mode is determined by properties of the dielectric material of the WGM resonator, the shape of the resonator, the external conditions, and strength of the coupling through the coupler (e.g. prism). The highest Q-factor may be achieved when all the parameters are properly balanced to achieve a critical coupling condition. In WGM resonators with uniform indices, if the coupler such as a prism touches the exterior surface of the resonator, the coupling is strong and this loading can render the Q factor to be small. Hence, the gap between the surface and the coupler is used to reduce the coupling and to increase the Q factor. In general, this gap is very small, e.g., less than one wavelength of the light to be coupled into a WG mode. Precise positioning devices such as piezo elements may be used to control and maintain this gap at a proper value.

Figure 8A:
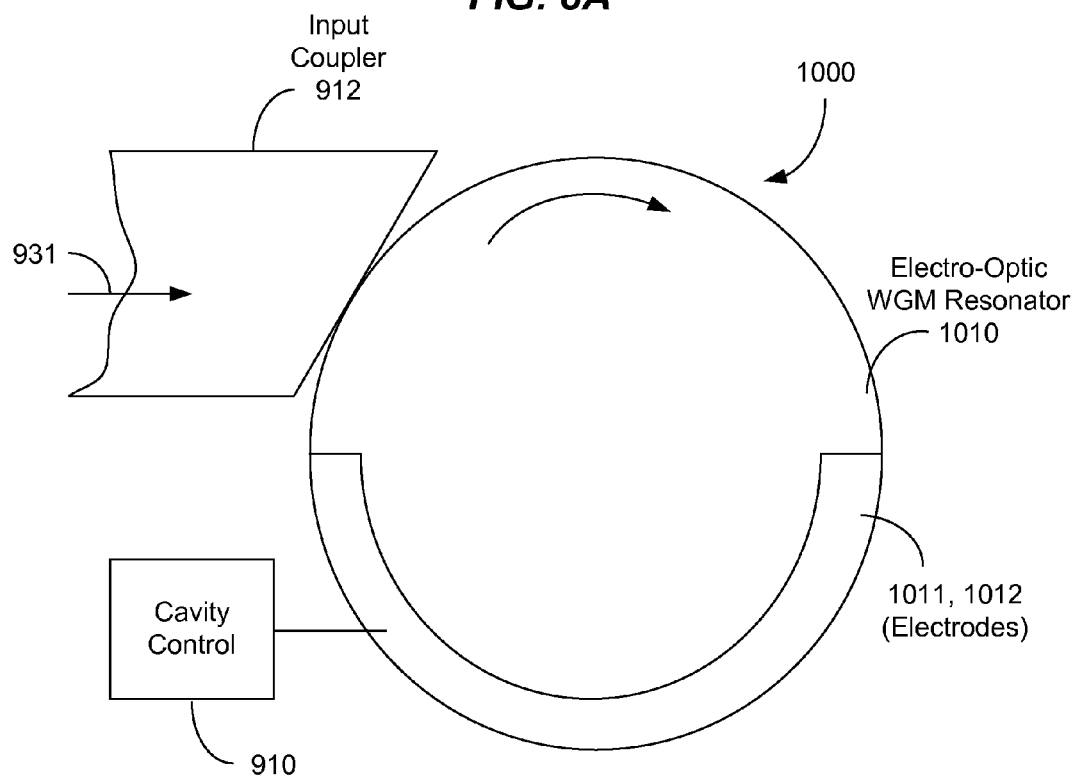
FIGS. 8A and 8B shows an example of a tunable electro-optic WGM resonator.
Figure 8B:
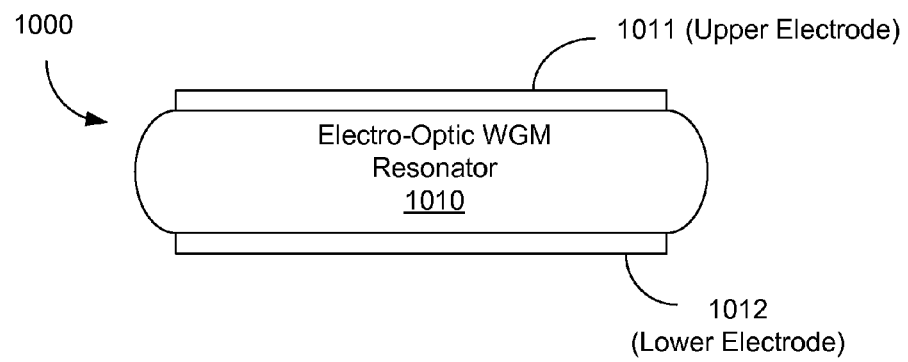

FIGS. 8A and 8B shows an example of a tunable electro-optic WGM resonator 1000 suitable for use in laser devices in this application. The electro-optic material for the resonator 1000 may be any suitable material, including an electro-optic crystal such as Lithium Niobate and semiconductor multiple quantum well structures. One or more electrodes 1011 and 1012 may be formed on the resonator 1000 to apply the control electrical field in the region where the WG modes are present to control the index of the electro-optical material and to change the filter function of the resonator. Assuming the resonator 1000 has disk or ring geometry as in FIG. 6A or 6B, the electrode 1011 may be formed on the top of the resonator and the electrode 1012 may be formed on the bottom of the resonator as illustrated in the side view of the device in FIG. 8B. In one implementation, the electrodes 1011 and 1012 may constitute an RF or microwave resonator to apply the RF or microwave signal to co-propagate along with the desired optical WG mode. The electrodes 1011 and 1012 may be microstrip line electrodes. A varying DC voltage can be applied to tune the WGM frequency and an RF or microwave signal can be applied to modulate the WGM frequency.

Figure 9:
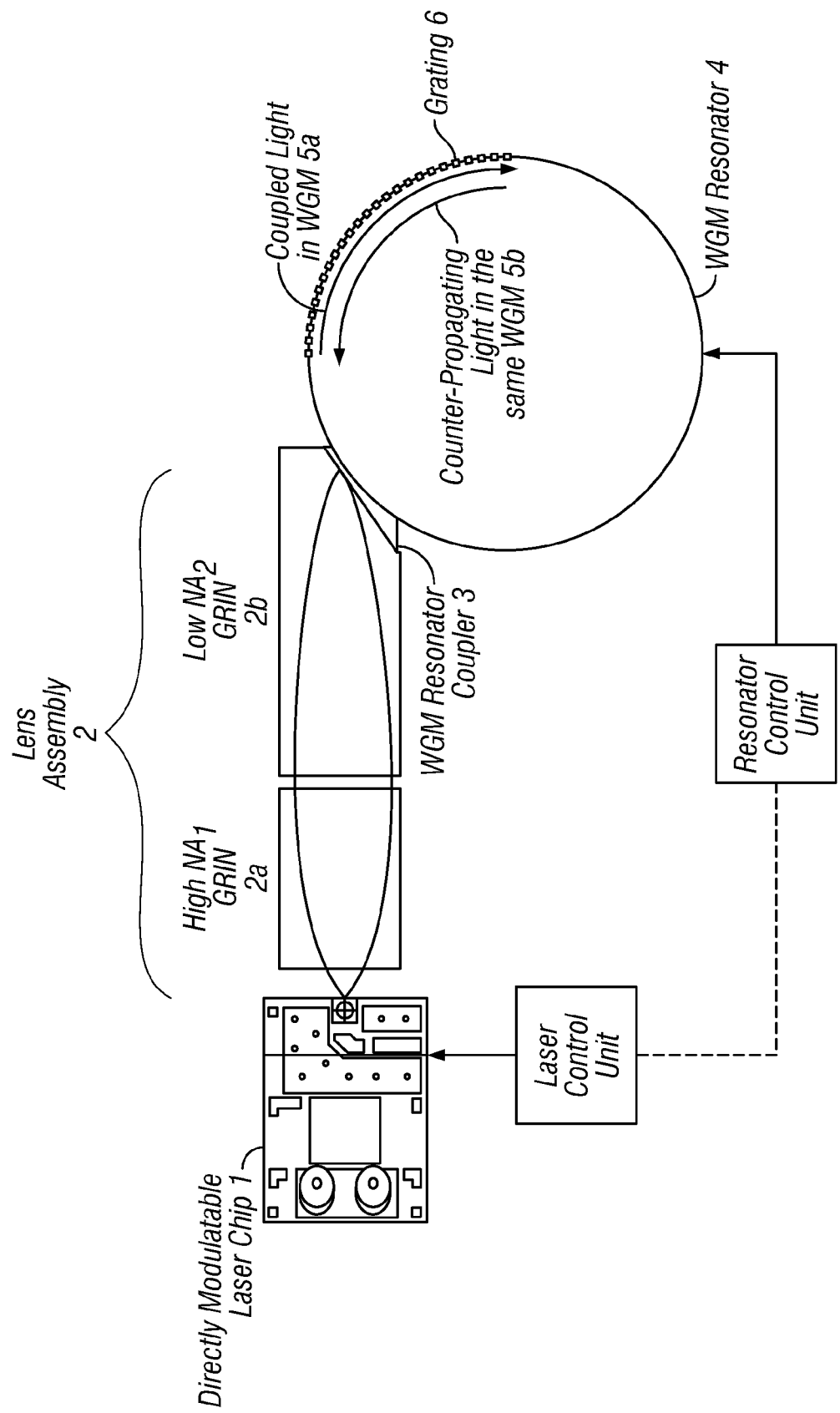
FIG. 9 shows an example of a laser device where a laser is optically coupled to a tunable whispering gallery mode optical resonator and is stabilized to the optical resonator via an optical feedback from the optical resonator.

FIG. 9 shows an example of a laser device where a laser is optically coupled to a tunable whispering gallery mode optical resonator and is stabilized to the optical resonator via an optical feedback from the optical resonator. In this example, a laser control unit is provided to control the laser 1 by tuning the laser or modulating the laser, and a resonator control unit is provided to tune or modulate the WG resonator. The laser control unit and the resonator control unit can be in communication with each other to simultaneously control the laser 1 and the resonator 4 under the injection locking operation condition.

For example, both the laser frequency and the WGM frequency of the resonator 4 can be tuned in synchronization. This may be achieved by splitting the voltage that is applied to the resonator 4 by the resonator control unit as a signal to the laser control unit. The laser control unit applies this split signal to control the current that drives the laser 1. This operation of simultaneous tuning both the laser 1 and the resonator 4 can increase the frequency tuning range of the laser device.

Based on the above, a tunable laser can be controlled and tuned by a whispering gallery mode optical resonator by coupling a laser output into the optical resonator which is made of an electrical-optic material to support a whispering gallery mode, and laser light out of laser light in the whispering gallery mode. The laser light coupled out of the optical resonator is then optically injected back into the laser to stabilize the laser frequency at a frequency of the whispering gallery mode and to reduce a linewidth of the laser. Either or both of the control signal to the laser and an electrical voltage applied to the electrical-optic material of the optical resonator can be controlled to tune the laser frequency while stabilizing the laser frequency at the frequency of the whispering gallery mode. Under this scheme, various operations can be achieved. For example, the electrical voltage applied to the electrical-optic material of the optical resonator can be modulated to modulate the laser frequency. For another example, the electrical voltage applied to the electrical-optic material of the optical resonator can be modulated to modulate the laser output out of the laser, and, the control signal to the laser is simultaneously tuned to tune the laser frequency.

Figure 10:
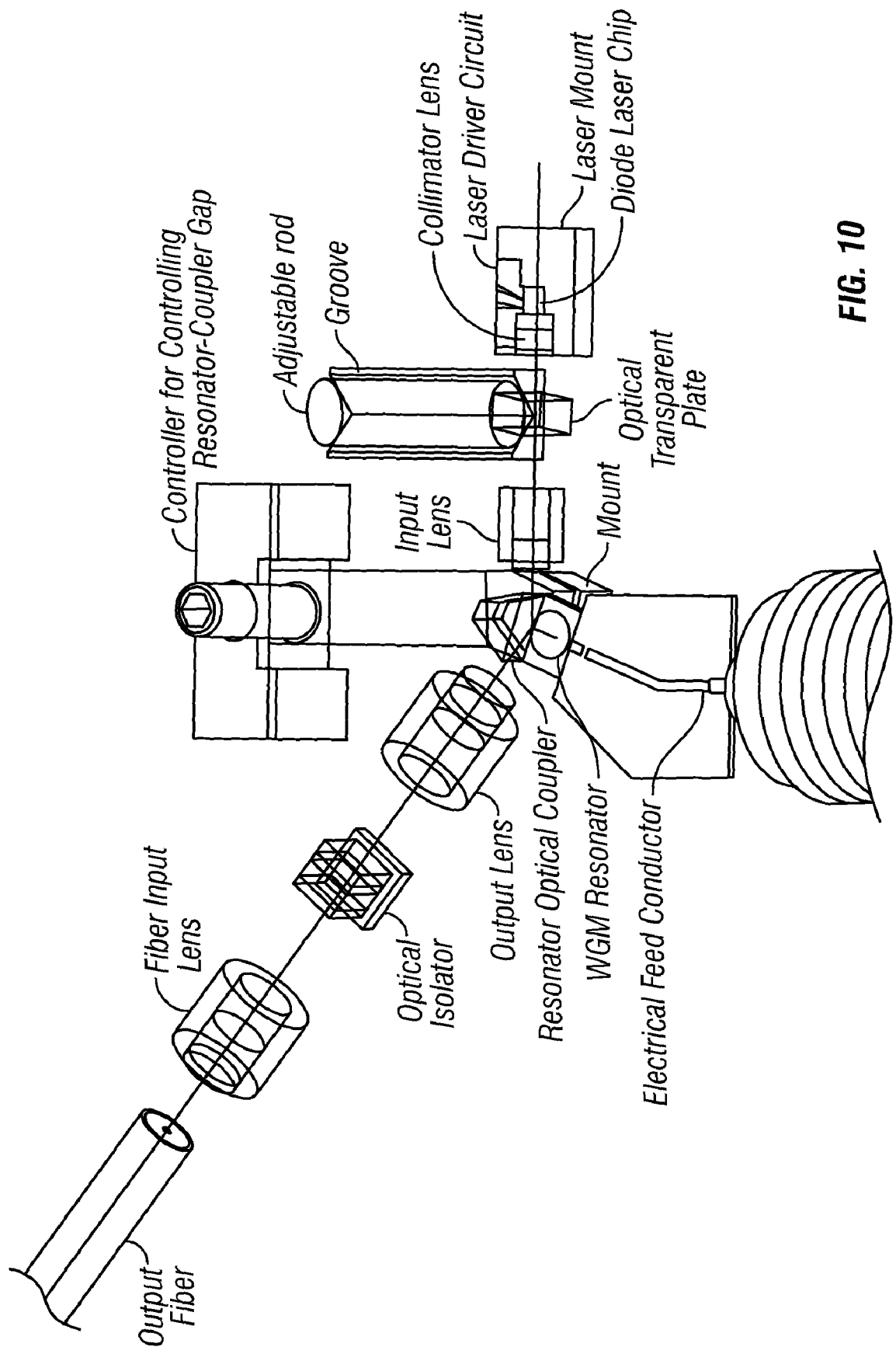
FIG. 10 shows an example of a compact laser device where a laser is optically coupled to a tunable whispering gallery mode optical resonator and is stabilized to the optical resonator via an optical feedback from the optical resonator.

FIG. 10 shows an example of a compact laser device where a laser is optically coupled to a tunable whispering gallery mode optical resonator and is stabilized to the optical resonator via an optical feedback from the optical resonator. This compact laser device includes a base plate on which other components are mounted in a compact package. As illustrated, a semiconductor laser is mounted on the base plate and is tunable in response to a electrical laser control signal to produce a laser beam at a laser frequency. An optical resonator is mounted on the base plate and is made of an electrical-optic material to support light in a whispering gallery mode circulating along first and second directions opposite to each other in the optical resonator. An optical coupler is mounted on the base plate and is optically coupled to the optical resonator to evanescently couple laser light of the laser beam from the laser into the optical resonator as laser light in the whispering gallery mode and evanescently couple laser light out of the optical resonator to produce feedback laser light. A lens assembly is mounted on the base plate and is optically coupled between the laser and the optical coupler to direct the laser beam from the laser to the optical coupler and to direct the feedback laser light from the optical coupler into the laser. For the resonator, an electrode is formed on the optical resonator to receive an electrical resonator control signal and an electrical feed conductor is formed on the base plate to supply the electrical resonator control signal to the electrode on the optical resonator.

In order to ensure vertical alignment of the optical beam between the prism coupler, the resonator and the laser chip, an optical transparent plate is mounted on the base plate in an optical path between the laser and the optical resonator and is adjustable in its orientation to change a height of the laser beam from the base plate. An adjustable rob is movably placed in a groove holder and holds the transparent plate to provide the adjustment. The gap between the resonator and the prism coupler is controlled by a position controller engaged to the optical coupler and is operable to control a gap between the optical coupler and the optical resonator.

In another aspect, the optical coupler couples a laser output beam from the optical resonator, and the laser device includes an optical isolator mounted on the base plate to receive a laser output beam to as an output laser beam of the laser device.

Figure 11:
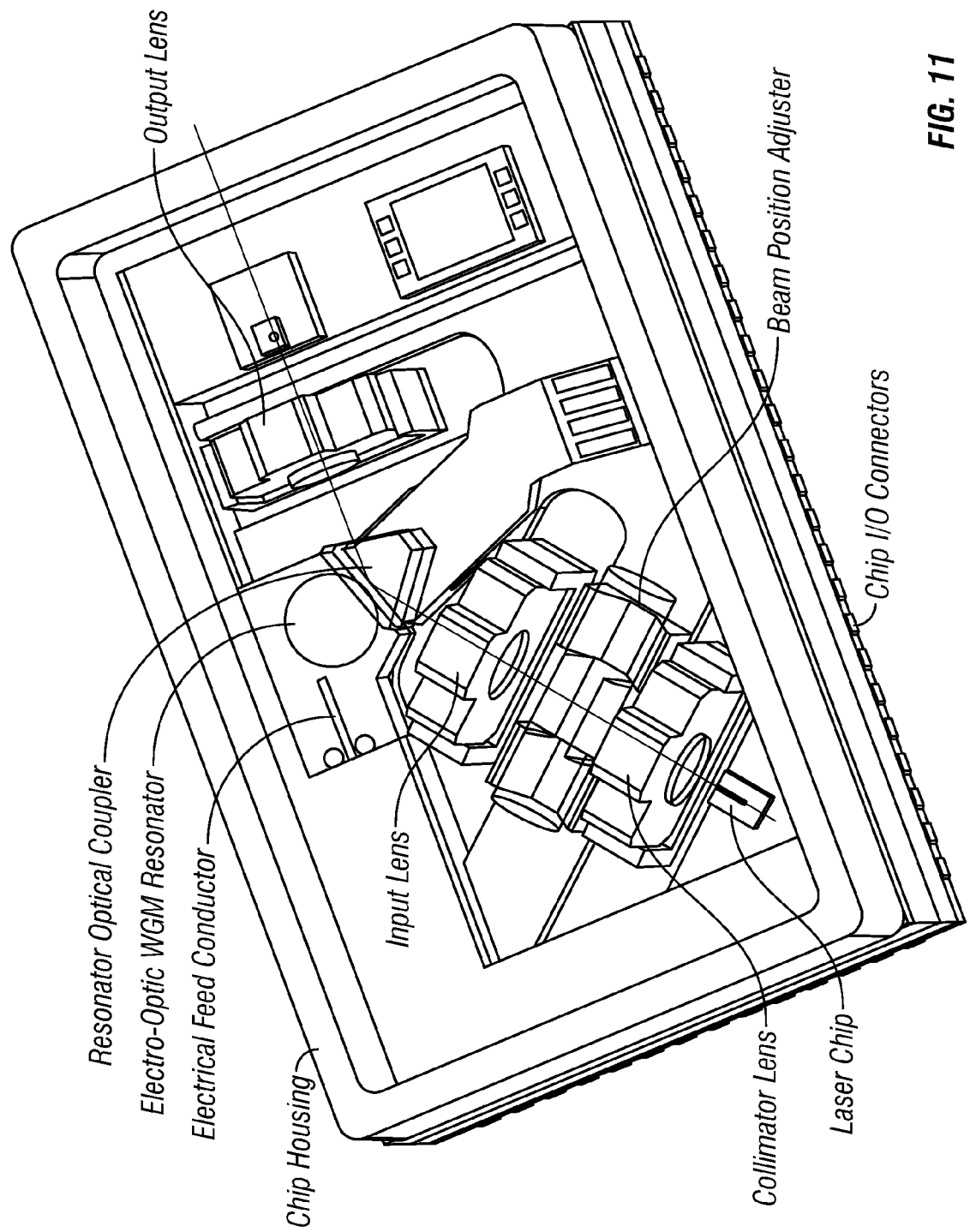
FIG. 11 shows a packaging example for the compact laser in FIG. 10.

FIG. 11 shows a packaging example for the compact laser in FIG. 10. This package includes chip I/O connectors to provide electrical input and output connections for all components inside the package such as the laser control and the resonator control units.

While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, it is understood that variations, enhancements and other implementations can be made based on what is described and illustrated in this patent application.

What is claimed is:

1. A laser device, comprising:
a laser that is tunable in response to a control signal and produces a laser beam at a laser frequency; and
an optical resonator structured to support a whispering gallery mode circulating in the optical resonator, the optical resonator being optically coupled to the laser to receive a portion of the laser beam into the optical resonator in the whispering gallery mode and to feed laser light in the whispering gallery mode in the optical resonator back to the laser to stabilize the laser frequency at a frequency of the whispering gallery mode and to reduce a linewidth of the laser,
wherein the optical resonator includes a mechanism internal to the optical resonator that uses received light in the whispering gallery mode circulating in the optical resonator to generate counter-propagating light in the whispering gallery mode which is coupled out of the optical resonator back to the laser, and
wherein the internal mechanism of the optical resonator is an optical grating formed at a surface of the optical resonator to interact with the received light in the whispering gallery mode circulating in the optical resonator to generate the counter-propagating light in the whispering gallery mode which is coupled out of the optical resonator back to the laser.

2. The laser device as in claim 1, wherein:
the optical resonator is tunable to stabilize the whispering gallery mode against environmental perturbations and the feedback of the laser light from the optical resonator to the laser transfers stability of the whispering gallery mode in the optical resonator to the laser.

3. The laser device as in claim 1, comprising:
a resonator tuning mechanism that controls and tunes the frequency of the whispering gallery mode to tune the laser frequency of the laser via the feedback of the laser light from the optical resonator to the laser.

4. The laser device as in claim 3, wherein:
the resonator tuning mechanism controls and tunes a temperature of the optical resonator to tune the laser frequency of the laser.

5. The laser device as in claim 3, wherein:
the resonator tuning mechanism applies and controls a pressure exerted on the optical resonator to tune the laser frequency of the laser.

6. The laser device as in claim 3, wherein:
the optical resonator comprises an electro-optic material that changes a refractive index in response to an electrical potential applied to the optical resonator; and
the resonator tuning mechanism applies and controls the electrical potential to tune the laser frequency of the laser.

7. The laser device as in claim 6, wherein:
the resonator tuning mechanism is configured to modulate the electrical potential to modulate the frequency of the whispering gallery mode of the optical resonator and the laser frequency of the laser.

8. The laser device as in claim 6, comprising:
a control mechanism to both adjust the frequency of the whispering gallery mode of the optical resonator via the resonator tuning mechanism and to adjust the laser frequency of the laser while stabilizing the laser frequency at the frequency of the whispering gallery mode.

9. The laser device as in claim 1, comprising:
an optical coupler evanescently coupled to the optical resonator to couple light into and light out of the whispering gallery mode in the optical resonator; and
a lens assembly optically coupled between the laser and the optical coupler to direct the laser beam to the optical coupler and to direct the laser light from the optical resonator into the laser.

10. The laser device as in claim 9, wherein:
the lens assembly comprises a first GRIN lens located next to the laser and configured to have a small aperture to focus light into the laser and to collect light from the laser, and a second GRIN lens located next to the optical coupler and configured to have a large aperture to focus light into the optical coupler and to collect light from the optical coupler.

11. The laser device as in claim 10, wherein:
the optical coupler comprises a prism.

12. A laser device, comprising:
a base plate;
a semiconductor laser mounted on the base plate, that is tunable in response to an electrical laser control signal and produces a laser beam at a laser frequency;
an optical resonator mounted on the base plate, the optical resonator made of an electrical-optic material to support light in a whispering gallery mode circulating along first and second directions opposite to each other in the optical resonator;
an optical coupler mounted on the base plate, optically coupled to the optical resonator to evanescently couple laser light of the laser beam from the laser into the optical resonator as laser light in the whispering gallery mode and evanescently couple laser light out of the optical resonator to produce feedback laser light;
a lens assembly mounted on the base plate, optically coupled between the laser and the optical coupler to direct the laser beam from the laser to the optical coupler and to direct the feedback laser light from the optical coupler into the laser;
an electrode formed on the optical resonator to receive an electrical resonator control signal; and
an electrical feed conductor on the base plate to supply the electrical resonator control signal to the electrode on the optical resonator,
wherein the optical coupler is configured to couple the laser light of the laser beam from the laser into the optical resonator as the laser light in the whispering gallery mode along the first direction,
wherein the optical resonator includes an optical grating formed at a surface of the optical resonator to interact with the laser light in the whispering gallery mode along the first direction to produce counter-propagating laser light in the whispering gallery mode along the second direction which is coupled out of the optical resonator by the optical coupler as the feedback laser light to the laser.

13. The laser device as in claim 12, comprising:
an optical transparent plate mounted on the base plate in an optical path between the laser and the optical resonator and adjustable to change a height of the laser beam from the base plate.

14. The laser device as in claim 12, comprising:
an RF circuit to produce an RF modulation signal to the electrical feed conductor to modulate the optical resonator to cause an RF modulation in the laser beam.

15. The laser device as in claim 12, comprising:
a position control module engaged to the optical coupler and operable to control a gap between the optical coupler and the optical resonator.

16. The laser device as in claim 12, wherein the optical coupler couples a laser output beam from the optical resonator, and the laser device comprises an optical isolator mounted on the base plate to receive a laser output beam to as an output laser beam of the laser device.

17. The laser device as in claim 12, comprising:
a control unit that produces a common electrical control signal and splits the common electrical control signal into a first electrical control signal and a second electrical control signal, wherein the control unit applies the first electrical control signal to the laser as the electrical laser control signal and applies the second electrical control signal to the electrode as the electrical resonator control signal to synchronize tuning of the laser and tuning of the optical resonator.

18. A laser device, comprising:
a laser that is tunable in response to a control signal and produces a laser beam at a laser frequency; and
an optical resonator structured to support a whispering gallery mode circulating in the optical resonator, the optical resonator being optically coupled to the laser to receive a portion of the laser beam into the optical resonator in the whispering gallery mode and to feed laser light in the whispering gallery mode in the optical resonator back to the laser to stabilize the laser frequency at a frequency of the whispering gallery mode and to reduce a linewidth of the laser,
wherein the optical resonator includes a mechanism internal to the optical resonator that uses received light in the whispering gallery mode circulating in the optical resonator to generate counter-propagating light in the whispering gallery mode which is coupled out of the optical resonator back to the laser,
wherein:
the optical resonator is made of an electro-optic material exhibiting an electro-optic effect;
wherein the laser device further includes:
a control unit that applies an electrical control signal to the electro-optic material of the optical resonator to tune the optical resonator via the electro-optic effect and splits the electrical control signal into a second electrical control signal as the control signal applied to the laser, and wherein the control unit uses the electrical control signal and the second electrical control signal to synchronize tuning of the laser and tuning of the optical resonator while locking the laser to the optical resonator via feeding the laser light in the whispering gallery mode in the optical resonator back to the laser.

19. The laser device as in claim 18, wherein:
the optical resonator is tunable to stabilize the whispering gallery mode against environmental perturbations and the feedback of the laser light from the optical resonator to the laser transfers stability of the whispering gallery mode in the optical resonator to the laser.

20. The laser device as in claim 18, comprising:
a resonator tuning mechanism that controls and tunes the frequency of the whispering gallery mode to tune the laser frequency of the laser via the feedback of the laser light from the optical resonator to the laser.

21. The laser device as in claim 20, wherein:
the resonator tuning mechanism controls and tunes a temperature of the optical resonator to tune the laser frequency of the laser.

22. The laser device as in claim 20, wherein:
the resonator tuning mechanism applies and controls a pressure exerted on the optical resonator to tune the laser frequency of the laser.

23. The laser device as in claim 18, wherein:
the control unit is configured to modulate the frequency of the whispering gallery mode of the optical resonator and the laser frequency of the laser.

24. The laser device as in claim 18, comprising:
an optical coupler evanescently coupled to the optical resonator to couple light into and light out of the whispering gallery mode in the optical resonator; and
a lens assembly optically coupled between the laser and the optical coupler to direct the laser beam to the optical coupler and to direct the laser light from the optical resonator into the laser.

25. The laser device as in claim 24, wherein:
the lens assembly comprises a first GRIN lens located next to the laser and configured to have a small aperture to focus light into the laser and to collect light from the laser, and a second GRIN lens located next to the optical coupler and configured to have a large aperture to focus light into the optical coupler and to collect light from the optical coupler.

26. The laser device as in claim 25, wherein:
the optical coupler comprises a prism.

* * * * *

UNITED STATES PATENT AND TRADEMARK OFFICE
CERTIFICATE OF CORRECTION

PATENT NO. : 7,991,025 B2
APPLICATION NO. : 12/139449
DATED : August 2, 2011
INVENTOR(S) : Lutfollah Maleki and Vladimir Ilchenko It is certified that error appears in the above-identified patent and that said Letters Patent is hereby corrected as shown below:

On Page 2, item (56), under "OTHER PUBLICATIONS" in Column 1, Line 3, please delete "Sympsoium" and insert -- Symposium --, therefor.

On Page 3, item (56), under "OTHER PUBLICATIONS" in Column 1, Lines 8-9, please delete "Tecnhology," and insert -- Technology, --, therefor.

Signed and Sealed this
Third Day of January, 2012

David J. Kappos
*Director of the United States Patent and Trademark Office*